United States Patent
Turner et al.

(10) Patent No.: US 12,426,210 B2
(45) Date of Patent: Sep. 23, 2025

(54) SYSTEMS AND METHODS FOR SUPPORTING A HIGH THERMAL GRADIENT BETWEEN A QUBIT PLANE AND A CONTROL SYSTEM FOR THE QUBIT PLANE USING A SUPERCONDUCTING RIGID-FLEX CIRCUIT

(71) Applicant: Microsoft Technology Licensing, LLC, Redmond, WA (US)

(72) Inventors: Matthew David Turner, Carnation, WA (US); Craig Steven Ranta, Olympia, WA (US); Kevin James Kramer, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 232 days.

(21) Appl. No.: 18/449,329

(22) Filed: Aug. 14, 2023

(65) Prior Publication Data

US 2025/0063650 A1 Feb. 20, 2025

(51) Int. Cl.
*H05K 7/20* (2006.01)
*H01B 12/16* (2006.01)
*H05K 1/02* (2006.01)

(52) U.S. Cl.
CPC ......... *H05K 7/20372* (2013.01); *H01B 12/16* (2013.01); *H05K 1/0203* (2013.01); *H05K 7/20254* (2013.01)

(58) Field of Classification Search
CPC ........... H05K 7/20372; H05K 7/20254; H05K 1/0203; H01B 12/16
See application file for complete search history.

(56) References Cited

U.S. PATENT DOCUMENTS 10,141,493 B2 11/2018 Tuckerman
10,165,667 B1 * 12/2018 Christiansen .......... H05K 1/181
(Continued)

OTHER PUBLICATIONS

"10 Layer Rigid-Flex PCB with 4 Layer Flex Circuit Boards", Retrieved From: https://www.rigiflex.com/products-services/rigid-flex-pcb/10-layer-rigid-flex-4-layer-flex, Retrieved Date: Oct. 25, 2023, 8 Pages.

(Continued)

*Primary Examiner* — Zachary Pape
(74) *Attorney, Agent, or Firm* — Ranjeev Singh; Singh Law, PLLC

(57) ABSTRACT

Systems and methods for supporting a high thermal gradient between a qubit plane and a control system for the qubit plane are described. A system includes a qubit plane associated with a first rigid circuit portion of a superconducting rigid-flex circuit and a control system associated with a second rigid circuit portion of the superconducting rigid-flex circuit. The superconducting rigid-flex circuit includes a flexible circuit portion for interconnecting the first rigid circuit portion with the second rigid circuit portion. The system further includes a first cooling system operable to maintain an operating temperature for the qubit plane and the first rigid circuit portion of the superconducting rigid-flex circuit at or below 100 milli-kelvin. The system further includes a second cooling system operable to maintain an operating temperature for the control system and the second rigid circuit portion of the superconducting rigid-flex circuit at or below 10 kelvin.

20 Claims, 6 Drawing Sheets

(56) References Cited

U.S. PATENT DOCUMENTS

| | | | | |
|---|---|---|---|---|
| 10,453,592 | B1* | 10/2019 | Smith | H03K 19/195 |
| 10,897,069 | B2* | 1/2021 | Gumann | H01P 1/20363 |
| 11,509,310 | B2 | 11/2022 | Das et al. | |
| 12,027,361 | B2* | 7/2024 | Yee | H10N 60/0268 |
| 2013/0258595 | A1* | 10/2013 | Tuckerman | H05K 7/20372 |
| | | | | 165/104.11 |

OTHER PUBLICATIONS

"12 Layer Rigid-Flex PCB with Heat Sink", Retrieved From: htttps://www.rigiflex.com/products-services/rigid-flex-pcb/12-layer-rigid-flex-heat-sink, Retrieved Date: Oct. 25, 2023, 5 Pages.

"14 Layer Rigid-Flex PCB", Retrieved From: https://www.rigiflex.com/products-services/rigid-flex-pcb/14-layer-rigid-flex, Retrieved Date: Oct. 25, 2023, 7 Pages.

"4 Layer Rigid-Flex PCB with ENIG Finish", Retrieved From: https://www.rigiflex.com/products-services/rigid-flex-pcb/4-layer-rigid-flex-enig-finish, Retrieved Date: Oct. 25, 2023, 8 Pages.

"6 Layer Rigid-Flex PCB", Retrieved From: https://www.rigiflex.com/products-services/rigid-flex-pcb/6-layer-rigid-flex, Retrieved Date: Oct. 25, 2023, 8 Pages.

"8 Layer Rigid-Flex Circuit Boards", Retrieved From: https://www.rigiflex.com/products-services/rigid-flex-pcb/8-layer-rigid-flex, Retrieved Date: Oct. 25, 2023, 6 Pages.

"FR-4—Optimal Material for Fabrication of Printed Circuit Boards", Retrieved From: https://www.rigiflex.com/blog/fr-4-optimal-material-for-fabrication-of-printed-circuit-boards/, Jan. 12, 2015, 3 Pages.

"Industries & Application Areas Served", Retrieved From: https://www.rigiflex.com/industry-served, Retrieved Date: Oct. 25, 2023, 6 Pages.

"IPC Recommendations on PCB Material Selection", Retrieved From: https://www.rigiflex.com/blog/ipc-recommendations-on-pcb-material-selection/, Oct. 22, 2015, 3 Pages.

"Outstanding Flex Circuit Boards: For Versatile Application Needs", Retrieved From: https://www.rigiflex.com/products-services/flexible-pcb, Retrieved Date: Oct. 25, 2023, 8 Pages.

"Rigid Flex Circuit Boards Offering Outstanding Performance", Retrieved From: https://www.rigiflex.com/products-services/rigid-flex-pcb, Retrieved Date: Oct. 25, 2023, 7 Pages.

"Rigid-Flex PCBs Design Guidelines", Retrieved From: https://www.rigiflex.com/faq/rigid-flex-pcbs-design-guidelines, Retrieved Date: Oct. 25, 2023, 5 Pages.

"Rigid-Flex PCBs Manufacturing Processes", Retrieved From: https://www.rigiflex.com/faq/rigid-flex-pcbs-manufacturing-processes, Retrieved Date: Oct. 25, 2023, 9 Pages.

"Rigid-Flex PCBs Materials", Retrieved From: https://www.rigiflex.com/faq/rigid-flex-pcbs-materials, Retrieved Date: Oct. 25, 2023, 6 Pages.

"Standard & Custom High Quality Rigid Printed Circuit Boards", Retrieved From: https://www.rigiflex.com/products-services/rigid-pcb, Retrieved Date: Oct. 25, 2023, 8 Pages.

Pauka, et al., "A Cryogenic Interface for Controlling Many Qubits", In Repository of arXiv:1912.01299v1, Dec. 3, 2019, pp. 1-7.

* cited by examiner

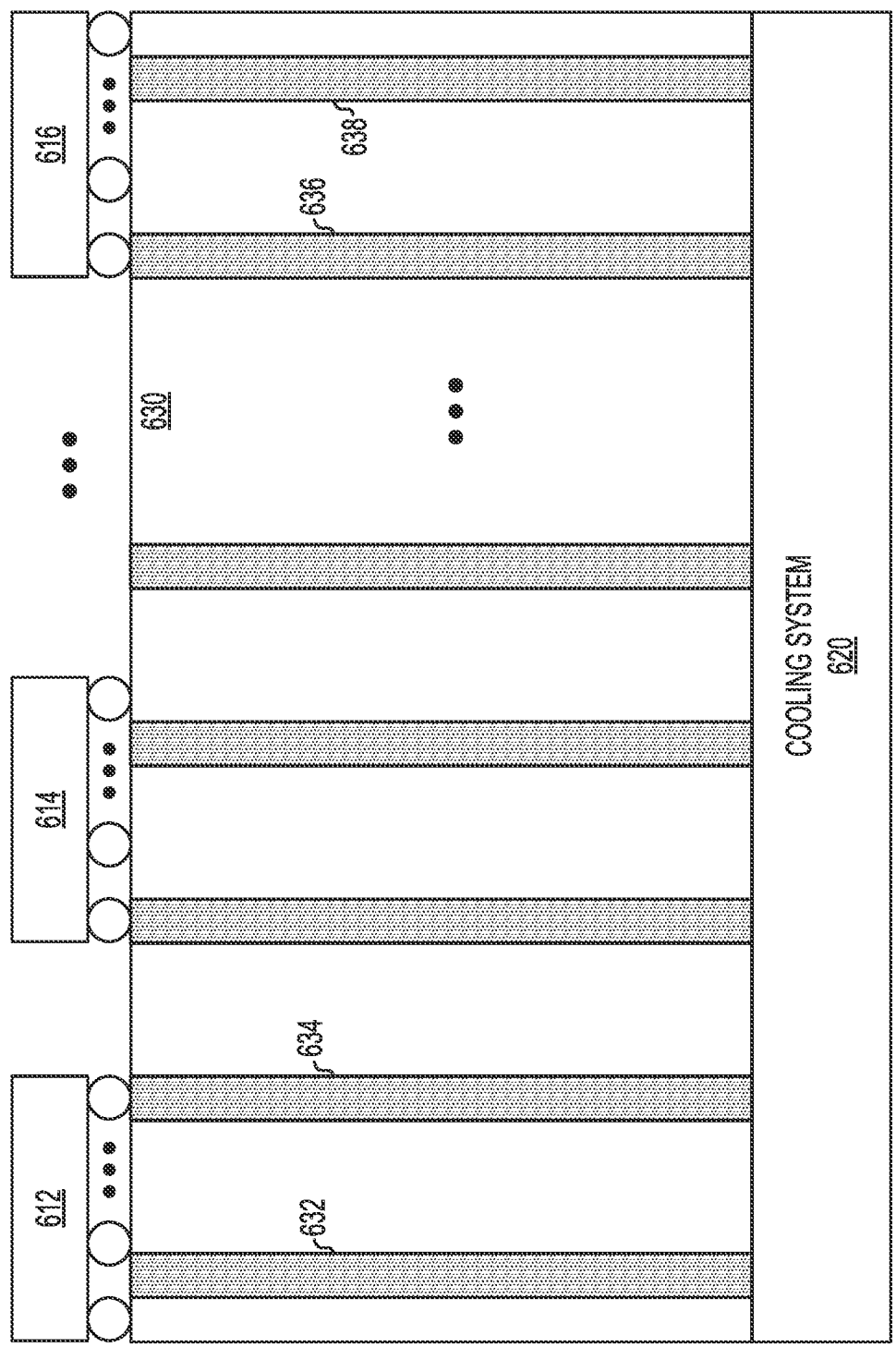

SYSTEMS AND METHODS FOR SUPPORTING A HIGH THERMAL GRADIENT BETWEEN A QUBIT PLANE AND A CONTROL SYSTEM FOR THE QUBIT PLANE USING A SUPERCONDUCTING RIGID-FLEX CIRCUIT

BACKGROUND

Controlling quantum devices requires generating a large number of static and dynamic voltage signals, and for quantum devices operating at cryogenic temperatures, the signals would ideally be generated at cryogenic temperatures in close integration with the quantum devices. This is a major challenge given that the cryogenic environment strongly constrains power dissipation of any active electronics. In addition, a large number of voltage signals also need to be coupled to the qubit gates' electrodes in the quantum devices. As a result, potentially many thousands or millions of wires may need to be connected to the voltage or current sources for driving the qubit gates in the quantum devices.

In sum, controlling large numbers of qubits presents a major challenge because of the IO-density bottleneck and the associated heat dissipated by the control circuitry. While a control chip operating in close proximity to the qubits helps address this challenge, the qubit chips must be cooled to milli-kelvin temperatures where cooling power is severely limited. In contrast, the electronics required to control the qubit devices are housed in integrated circuit chips that consume tens of microwatts to milliwatts of power. These integrated circuit chips generate heat commensurate with this much higher amount of power consumption, which must be removed in order to prevent the qubit plane from exceeding the cryogenic operating temperature (e.g., 100 mK). Accordingly, there is a need for better systems and methods for supporting a high thermal gradient between the qubit plane and a control system for the qubit plane.

SUMMARY

In one example, the present disclosure relates to a system including a qubit plane having at least one qubit chip associated with a first rigid circuit portion of a superconducting rigid-flex circuit. The system may further include a first cooling system operable to maintain an operating temperature for the qubit plane and the first rigid circuit portion of the superconducting rigid-flex circuit at or below 100 milli-kelvin.

The system may further include a control system having at least one control chip associated with a second rigid circuit portion of the superconducting rigid-flex circuit. The system may further include a second cooling system operable to maintain an operating temperature for the control system and the second rigid circuit portion of the superconducting rigid-flex circuit at or below 10 kelvin, allowing the at least one control chip to dissipate heat to the second cooling system within a thermal budget commensurate with an amount of power required to provide control signals to control qubits within the at least one qubit chip. The system may further include a flexible circuit portion of the superconducting rigid-flex circuit for interconnecting the first rigid circuit portion of the superconducting rigid-flex circuit with the second rigid circuit portion of the superconducting rigid-flex circuit.

In another example, the present disclosure relates to a method including providing a qubit plane having at least one qubit chip associated with a first rigid circuit portion of a superconducting rigid-flex circuit. The method may further include using a first cooling system maintaining an operating temperature for the qubit plane and the first rigid circuit portion of the superconducting rigid-flex circuit at or below 100 milli-kelvin.

The method may further include providing a control system having at least one control chip associated with a second rigid circuit portion of the superconducting rigid-flex circuit. The method may further include using a second cooling system maintaining an operating temperature for the control system and the second rigid circuit portion of the superconducting rigid-flex circuit at or below 10 kelvin, allowing the control chips to dissipate heat to the second cooling system within a thermal budget commensurate with an amount of power required to provide control signals to control qubits within the at least one qubit chip. The method may further include providing a flexible circuit portion of the superconducting rigid-flex circuit for interconnecting the first rigid circuit portion of the superconducting rigid-flex circuit with the second rigid circuit portion of the superconducting rigid-flex circuit.

In yet another example, the present disclosure relates to a system configured to operate in a cryogenic environment, where the cryogenic environment has a vacuum with a pressure in a range of $10^{-3}$ Torr to $10^{-10}$ Torr. The system may further include a qubit plane having qubit chips associated with a first rigid circuit portion of a superconducting rigid-flex circuit. The system may further include a first cooling system operable to maintain an operating temperature for the qubit plane and the first rigid circuit portion of the superconducting rigid-flex circuit at or below 100 milli-kelvin.

The system may further include a control system having control chips associated with a second rigid circuit portion of the superconducting rigid-flex circuit. The system may further include a second cooling system operable to maintain an operating temperature for the control system and the second rigid circuit portion of the superconducting rigid-flex circuit at or below 10 kelvin, allowing the control chips to dissipate heat to the second cooling system within a thermal budget commensurate with an amount of power required to provide control signals to control qubits within the qubit chips.

The system may further include a flexible circuit portion of the superconducting rigid-flex circuit for interconnecting, and yet thermally isolating, the first rigid circuit portion of the superconducting rigid-flex circuit with the second rigid circuit portion of the superconducting rigid-flex circuit. The system may further include a third cooling system operable to maintain an operating temperature of the flexible circuit portion within a range of 100 milli-kelvin to 10 kelvin.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 6 shows a side view of a rigid circuit portion of a superconducting rigid-flex circuit for use with the systems of FIG. 1 and FIG. 2.

DETAILED DESCRIPTION

The present disclosure relates to systems and methods for supporting a high thermal gradient between a qubit plane and a control system for the qubit plane using a superconducting rigid-flex circuit. To facilitate scalable and large-scale quantum computing, the cryogenic control system for the quantum devices must be interconnected with thousands of wires in a system yet remain thermally isolated. This is a significant challenge as the current thermal cooling designs (e.g., dilution refrigerators) to achieve milli-kelvin (mK) temperatures do not support this capability. Dilution refrigerators are capable of cooling to tens of mK (via He3/He4 mixing) heat in the microwatts range. The electronics required to control the qubit devices are housed in integrated circuit chips that consume tens of microwatts to milliwatts of power. These integrated circuit chips generate heat commensurate with this much higher amount of power consumption, which must be removed in order to prevent the qubit plane from exceeding the cryogenic operating temperature (e.g., 100 mK).

Certain dilution refrigerators are able to provide higher cooling powers at higher temperatures at various stages within the refrigerator. One such zone of a dilution refrigerator known as the cold plate is a potential candidate for locating cryogenic control electronics for the qubit plane. The cold plate zone can operate at around 100-600 mK. The below 100 mK temperature zone in a dilution refrigerator, however, is separated from the cold plate zone and it is on a different plane from the cold plate zone, making it difficult to have a single planar printed circuit board that can be thermally attached to both temperature zones.

Examples in the present disclosure relate to using a superconducting rigid-flex circuit as an interconnect between a cryogenic control system for the qubit chips and the qubit chips themselves. This approach, given the much lower thermal conductivity of superconductors compared to normal conductors, allows the cryogenic control system to operate at a significantly higher temperature than the qubit chips and generate tens of microwatts to milliwatts of heat while being connected to the qubit plane, which must operate below 100 mK, generating only microwatts of heat. In sum, this approach allows for electrical conductivity between the control chips and the qubit chips while thermally isolating them within a dilution refrigerator or using multiple dilution refrigerators.

Figure 1:
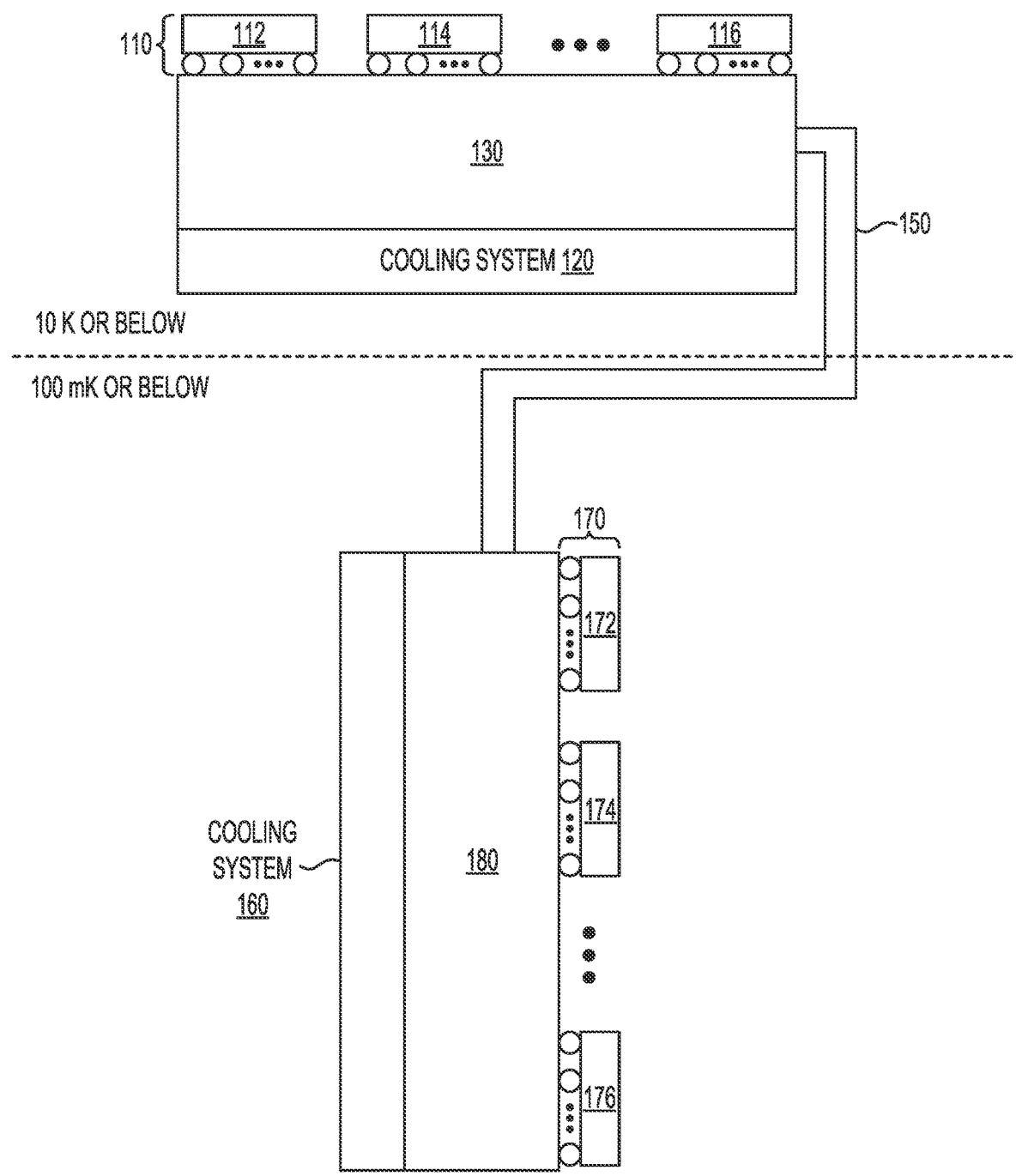
FIG. 1 shows an example of a system for supporting a high thermal gradient between the qubit plane and a control system for the qubit plane using a superconducting rigid-flex circuit.

FIG. 1 shows an example system 100 for supporting a high thermal gradient between the qubit plane and a control system for the qubit plane using a superconducting rigid-flex circuit. System 100 is configured to operate in a cryogenic environment. A system operating in the cryogenic environment requires a vacuum to operate properly. In one example, the vacuum may relate to a pressure in a range of $10^{-3}$ Torr to $10^{-10}$ Torr. In one example, temperature range for the cryogenic environment may be between 5 milli-kelvin to 10 kelvin. It is to be recognized that the temperature ranges referred to herein relate to the temperature of the environment in which the components of system 100 are operating and not the temperature of the components themselves. Thus, references such as "operating at" or "maintained at" refer to the temperature of the environment in which these components are operating or are being maintained inside.

With continued reference to FIG. 1, system 100 may include two different temperature zones—one at 10 K or below and another at 100 mK or below. The 10 K or below temperature zone includes the components related to control system 110 for the qubit plane and the 100 mK or below temperature zone includes the components related to qubit plane 170. In this example, system 100 includes a superconducting rigid-flex circuit, which is implemented as a rigid-flex printed circuit board (PCB). The superconducting rigid-flex circuit includes a rigid circuit portion 130, a flexible circuit portion 150, and another rigid circuit portion 180. In this example, each of rigid circuit portion 130 and rigid circuit portion 180 may include both superconducting and non-superconducting interconnect layers. However, flexible circuit portion 130 includes superconducting interconnect layers only. Control chips (e.g., integrated circuit chips) 112, 114, and 116, which are associated with control system 110, are mounted on (or otherwise coupled to) rigid circuit portion 130.

One type of control architecture for controlling qubits (e.g., solid-state qubits) includes one or more integrated circuit control chips, containing cryogenic control circuits. Each control chip can store a charge on a capacitor (that includes the interconnect capacitance) to generate a voltage bias. One or more digital to analog converters may be used to set the charge on each capacitor, which at cryo-temperatures remains for a long time on account of the extremely low leakage pathways at these temperatures. Refresh of the charge can be made cyclically on a timescale commensurate with qubit operation. As an example, the control system may include analog-to-digital converters (ADCs), digital-to-analog converters (DACs), digital signal processors (DSPs), and field-programmable gate arrays (FPGAs). Control chips associated with control system 110 for the qubits may be implemented using various semiconductor technologies, including complimentary metal-oxide-semiconductor (CMOS), silicon-germanium (SiGe), or any of the III-V compound semiconductors. The control chips may further include passive circuits, voltage dividers, capacitors, resistors, interconnect structures, and other circuits/structures.

Still referring to FIG. 1, qubit chips 172, 174, and 176, which are associated with the qubit plane 170, are mounted on (or otherwise coupled to) rigid circuit portion 180. Qubit plane 170 may include topological quantum bits (qubits) or other solid-state qubits that may be required to operate below a temperature of 100 milli-kelvin (e.g., within a range of approximately 5 milli-kelvin to 100 milli-kelvin). The qubits may process quantum information for a quantum computer. A qubit may be implemented using various physical systems, including photons, electrons, Josephson junctions, quantum dots, or heterostructures. The quantum state(s) may be encoded as a direction of spin, another aspect of spin, charge, energy, or excitation stages as part of a qubit, or a topological phase of superconducting matter. The example qubits may operate based on either low-frequency DC signals (e.g., bias voltages or currents) or high-frequency radio frequency signals (e.g., 1 GHz to 10 GHz signals) or based on a combination of both. In certain examples, microwave signals may be used to control the superconducting devices, including, for example, the state of the quantum bits (qubits). Certain implementations of the gates for quantum bits (qubits) may require high-frequency microwave signals. The qubits may be read out using frequency multiplexing.

For the dynamic control of the qubits, one or more voltage pulses may be required to rapidly change the potential of a gate and the energy state of the qubit. Generating such pulses remotely from the qubit plane requires significant energy, often due to the use of attenuators at each temperature stage for thermalization of electrons. The signals (e.g., pulses or other signals) for controlling each of the qubits may include a left wall (LW) signal, a left plunger (LP) signal, a center wall (CW) signal, a right plunger (RP) signal, and a right wall (RW) signal). Additional signals related to sensing the quantum dot in the qubit gate may include sensing dot top gate signal, sensing dot plunger signal, and sensing dot bottom gate signal. Additional, or different, control signals may be required depending on the type of the qubit. With thousands of qubits being located on each qubit chip associated with qubit plane 170, the electronics required to control the qubit chips in control system 110 consumes milli-watts of power while generating such control signals for the qubits. Accordingly, the control chips associated with control system 110 generate heat commensurate with this much higher amount of power consumption, which must be removed in order to prevent the qubit plane from exceeding the cryogenic operating temperature (e.g., 100 mK).

With continued reference to FIG. 1, flexible circuit portion 150 of the superconducting rigid-flex circuit includes interconnecting superconducting wires and other such structures to allow for the interconnection of control chips 112, 114, and 116 with qubit chips 172, 174, and 176. Flexible circuit portion 150 may be formed as a flexible circuit by forming superconducting metal wires on flexible substrates, such as polyimide (e.g., KAPTON®). Superconducting metal may be any superconducting metal, including niobium or aluminum. Other related alloys (e.g., niobium nitride (NbN) or niobium-titanium-nitride (NbTiN)) may also be used. Multiple layers of superconducting metal, separated by a flexible dielectric (e.g., polyimide), may be formed as part of flexible circuit portion 150. Superconductive metal layers may also be a laminate of a superconductor (e.g., niobium or niobium nitride). Superconducting metal layers associated with flexible circuit portion 150 are formed to extend into rigid circuit portions 130 and 180. Additional details regarding the formation of superconducting rigid-flex circuits are provided with respect to FIG. 5 and FIG. 6.

Still referring to FIG. 1, as part of system 100, two cooling systems—one for the qubits and a second one for the control system for controlling the qubits—are used. As described herein, the two cooling systems may be completely independent cooling systems or could be sub-systems of the same cooling system (e.g., a single dilution refrigerator). Cooling system 120, coupled to rigid circuit portion 130 and control system 110 for the qubits (e.g., devices 112, 114, and 116), is configured to achieve a temperature range for the cryogenic control system (e.g., <10 K). As explained earlier, in one example, cooling system 120 may correspond to a cold plate or another type cooling system (e.g., liquid helium pipes or other such cooling systems). Cooling system 160, coupled to rigid circuit portion 170 and qubit plane 170 having integrated circuit chips comprising qubits (e.g., qubit devices 172, 174, and 176), is configured to achieve a temperature range for the qubit plane (e.g., <100 mK). Cooling system 160 may include a dilution refrigerator, a pumped helium-3 refrigerator, or a pumped helium-4 refrigerator. The dilution refrigerator may be configured by setting the various parameters of the heat exchangers, including mixing chamber morphology, flow impedance, the ratio of 3He and 4He, and the mixture flow rate.

Advantageously, the use of the superconducting rigid-flex circuit to physically separate the qubits from the control system for the qubits eliminates the requirement for these sub-systems to be co-located in the same geometric plane, while providing thermal isolation. In addition, the heat is extracted from each of the control chips and the qubit chips in a direction that is orthogonal to the direction of the plane in which these chips are arranged. In addition, advantageously the use of the superconducting rigid-flex circuit allows PCB-level wiring density without having connectors to connect the interconnect with the control chips for the control system and the qubit chips for the qubit plane, respectively.

The two cooling systems may be part of a single dilution refrigerator if the heat leak from the cold plate to the mixing chamber plate is within the mixing chamber specification. If the heat leakage is too high, then the control system could be cooled using the any stage of the dilution refrigerator (or an alternate cooling system) and a different dilution refrigerator may be used as the cooling system for the qubit plane. Moreover, as explained later with respect to FIG. 4, another cooling state or another dilution refrigerator may be used to thermalize the flexible circuit portion 150 as it is routed from the control system to the qubit plane. Advantageously, system 100 as described with respect to FIG. 1 and a method for operating this system supports high density interconnects at relatively large distance and a high thermal gradient (e.g., from 10 K to 100 mK). The high thermal gradient is possible between hot and cold sections without requiring exotic substrates, such as Macor. As explained later, this method also provides additional opportunities to thermalize wiring as it passes from a hot to cold section. As a result, system 100 provides a means to use a single cold finger with a more uniform magnetic field, relative to having multiple cold fingers which would require a larger magnet and bore and complicate the positioning of the quantum devices.

Moreover, as part of system 100, qubits may be read by coupling a qubit to a resonator so that the two different states of the qubit shift the resonance frequency differently. As an example, the frequency change can be detected by measuring the phase of a microwave pulse using the resonator. Higher electron temperature caused by any injection of hot electrons from control system 110 to qubit plane 170 may cause noise-induced spreading of the resonant function. The isolation between control system 110 and qubit plane 170, provided by flexible circuit portion 150, also helps prevent such noise-related issues by minimizing the effect of hot electrons on the performance of the qubits in the qubit plane 170. Although FIG. 1 shows system 100 as including certain components that are arranged in a certain way, system 100 may include additional or fewer components arranged differently. As an example, the control chips may be coupled to rigid circuit portion 130 differently from the type of coupling shown in FIG. 1. Similarly, the qubit chips may be coupled to rigid circuit portion 180 differently from the type of coupling shown in FIG. 1.

Figure 2:
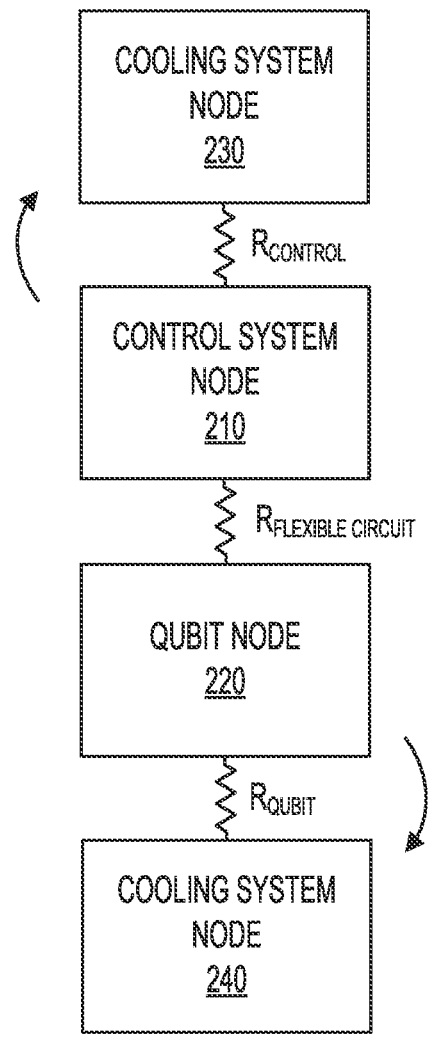
FIG. 2 shows a thermal-resistance model of the system of FIG. 1.

FIG. 2 shows a thermal-resistance model 200 of system 100 of FIG. 1. Each resistor ($R_{FLEXIBLE\ CIRCUIT}$, $R_{CONTROL}$, and $R_{QUBIT}$) in this thermal-resistance model represents a certain amount of thermal resistance and the current flowing through the resistor can be viewed as the amount of heat flowing through the resistor. Thermal-resistance model 200 further includes a first cooling system node 230 and another cooling system node 240. In this model, the node labeled as control system node 210 corresponds to the temperature of the rigid circuit portion (e.g., rigid circuit portion 110 of FIG. 1) and the control circuitry for controlling qubits and the other node labeled as qubit node 220 corresponds to the temperature of the other rigid circuit portion (e.g., rigid circuit portion 170 of FIG. 1) and the qubit plane.

Thermal-resistance model 200 may be used to evaluate and improve the performance of system 100 of FIG. 1 by computing heat transfer across regions. Despite there being a large temperature gradient between control system node 210 and qubit node 220, most of the heat dissipated by control system node 210 flows to cooling system node 230. This approach is facilitated by using anisotropic thermal conductivity substrates where the heat transport is in the vertical direction relative to the device being cooled but not in the horizontal direction. This facilitates independent heat removal from the control system node 210 and qubit node 220 while minimizing any heat flow between the two. In sum, the PCB layers in the rigid-flex circuit are intentionally designed to emulate thermal anisotropy. Although not shown in FIG. 2, thermal resistance modeling for additional temperature stages and cooling systems associated with the rigid circuit portion (e.g., rigid circuit portion 110 of FIG. 1) and the control circuitry for controlling qubits and with the other rigid circuit portion (e.g., rigid circuit portion 170 of FIG. 1) and the qubit plane may also be performed.

Figure 3:
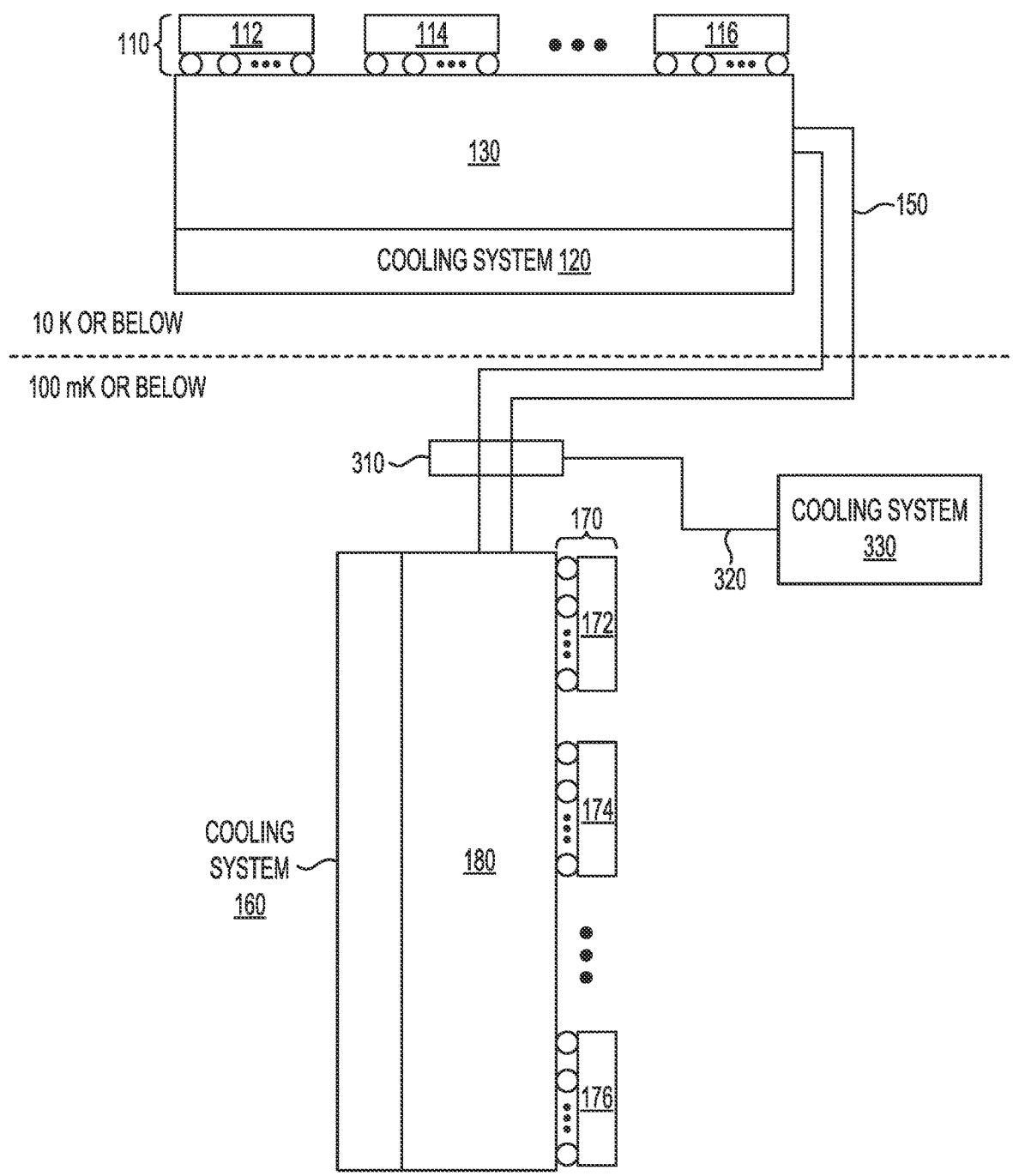
FIG. 3 shows another example of a system for supporting a high thermal gradient between the qubit plane and a control system for the qubit plane using a superconducting rigid-flex circuit.

FIG. 3 shows another example system 300 for supporting a high thermal gradient between the qubit plane and a control system for the qubit plane using a superconducting rigid-flex circuit. The same or similar components that are shown in FIG. 3 are referred to using the same reference numbers as used in FIG. 1. System 300 (similar to system 100) is also configured to operate in a cryogenic environment, including a vacuum having a pressure in a range of $10^{-3}$ Torr to $10^{-10}$ Torr. In one example, the cryogenic environment may require the temperature range to be between 5 milli-kelvin to 10 kelvin.

With continued reference to FIG. 3, like system 100, system 300 may include two different temperature zones-one at 10 K or below and another at 100 mK or below. The 10 K or below temperature zone includes the components related to control system 110 for the qubit plane and the 100 mK or below temperature zone includes the components related to qubit plane 170. System 300 includes a superconducting rigid-flex circuit, which is implemented as a rigid-flex printed circuit board (PCB). The superconducting rigid-flex circuit includes a rigid circuit portion 130, a flexible circuit portion 150, and another rigid circuit portion 180. In this example, each of rigid circuit portion 130 and rigid circuit portion 180 may include both superconducting and non-superconducting interconnect layers. However, flexible circuit portion 130 includes superconducting interconnect layers only. Control chips (e.g., integrated circuit chips) 112, 114, and 116, which are associated with control system 110, are mounted on (or otherwise coupled to) rigid circuit portion 130. A similar type of control architecture for controlling qubits (e.g., solid-state qubits) such as one or more integrated circuit control chips, containing cryogenic control circuits, may be used with system 300.

Still referring to FIG. 3, similar to system 100 of FIG. 1, qubit chips 172, 174, and 176, which are associated with the qubit plane 170, are mounted on (or otherwise coupled to) rigid circuit portion 180. Qubit plane 170 may include topological quantum bits (qubits) or other solid-state qubits that may be required to operate below a temperature of 100 milli-kelvin (e.g., within a range of approximately 5 milli-kelvin to 100 milli-kelvin). As explained earlier, with thousands of qubits being located on each qubit chip associated with qubit plane 170, the electronics required to control the qubit chips in control system 110 consumes milli-watts of power while generating such control signals for the qubits. Accordingly, the control chips associated with the control system 110 generate heat commensurate with this much higher amount of power consumption, which must be removed in order to prevent the qubit plane from exceeding the cryogenic operating temperature (e.g., 100 mK).

With continued reference to FIG. 3, like system 100 of FIG. 1, flexible circuit portion 150 includes interconnecting wires and other such structures to allow for the interconnection of control chips 112, 114, and 116 with qubit chips 172, 174, and 176. Flexible circuit portion 150 may be formed as a flexible circuit by forming superconducting metal wires on flexible substrates, such as polyimide (e.g., KAPTON®). Superconducting metal may be any superconducting metal, including niobium or aluminum. Other related alloys (e.g., niobium nitride (NbN) or niobium-titanium-nitride (NbTiN)) may also be used. Multiple layers of superconducting metal, separated by a flexible dielectric (e.g., polyimide) may be formed as part of flexible circuit portion 150. Superconductive metal layers may also be a laminate of a superconductor (e.g., niobium or niobium nitride). Superconducting metal layers associated with flexible circuit portion 150 are formed to extend into rigid circuit portions 130 and 180. Additional details regarding the formation of superconducting rigid-flex circuits are provided with respect to FIG. 5.

Still referring to FIG. 3, unlike system 100 of FIG. 1, as part of system 300, three cooling systems—one for the qubits, a second one for the flexible circuit portion, and a third one for the control system for controlling the qubits—are used. As described herein, the three cooling systems may be completely independent cooling systems or could be sub-systems of the same cooling system (e.g., a single dilution refrigerator). Cooling system 120, coupled to rigid circuit portion 130 and control system 110 for the qubits (e.g., devices 112, 114, and 116), is configured to achieve a temperature range for the cryogenic control system (e.g., <10 K). As explained earlier, in one example, cooling system 120 may correspond to a cold plate or another type cooling system (e.g., liquid helium pipes or other such cooling systems).

Cooling system 330 may be coupled to flexible circuit portion 150 to thermalize the flexible circuit portion 150 as it is routed from the control system 110 to the qubit plane 170. In this example, a thermal clamp 310 may be used to clamp (or otherwise attach) to flexible circuit portion 150. Cooling system 330 may be coupled to flexible circuit portion 150 via thermal clamp 310 and a physical connector 320. Cooling system 330, coupled to flexible circuit portion 150, is configured to achieve the same (or similar) temperature range as for the qubit plane (e.g., <100 mK). Cooling system 160, coupled to rigid circuit portion 170 and qubit plane 170 having integrated circuit chips comprising qubits (e.g., qubit devices 172, 174, and 176), is configured to achieve a temperature range for the qubit plane (e.g., <100 mK). Each of cooling system 160 and cooling system 330 may include a dilution refrigerator, a pumped helium-3 refrigerator, or a pumped helium-4 refrigerator. The same dilution refrigerator may be used as the cooling system 160 and the cooling system 330. The dilution refrigerator may be configured by setting the various parameters of the heat exchangers, including mixing chamber morphology, flow impedance, the ratio of 3He and 4He, and the mixture flow rate.

Advantageously, the use of the superconducting rigid-flex circuit to physically separate the qubits from the control system for the qubits eliminates the requirement for these sub-systems to be co-located in the same geometric plane, while providing thermal isolation. In addition, the use of the superconducting rigid-flex circuit allows PCB-level wiring density without having connectors to connect the interconnect with the control system and the qubit devices, respectively. The three cooling systems may be part of a single dilution refrigerator if the heat leak from the cold plate to the mixing chamber plate is within the mixing chamber specification. If the heat leakage is too high, then the control system could be cooled using the cold plate and a different dilution refrigerator may be used as the cooling system for the qubit plane. Moreover, as needed, a separate dilution refrigerator may be used to thermalize the flexible circuit portion. Advantageously, similar to system 100 described with respect to FIG. 1, system 300 and a method for operating this system supports high density interconnects at relatively large distance and a high thermal gradient. The high thermal gradient is possible between hot and cold sections without requiring exotic substrates, such as Macor. As a result, system 300 provides a means to use a single cold finger with a more uniform magnetic field, relative to having multiple cold fingers which would require a larger magnet and bore and complicate the positioning of the quantum devices.

Moreover, as part of system 300, similar to as described with respect to system 100 of FIG. 1, qubits may be read by coupling a qubit to a resonator so that the two different states of the qubit shift the resonance frequency differently. As an example, the frequency change can be detected by measuring the phase of a microwave pulse using the resonator. Higher electron temperature caused by any injection of hot electrons from control system 110 to qubit plane 170 may cause noise-induced spreading of the resonant function. The isolation between control system 110 and qubit plane 170, provided by flexible circuit portion 150 (having a separate cooling system), also helps prevent such noise-related issues by minimizing the effect of hot electrons on the performance of the qubits in the qubit plane 170. Although FIG. 3 shows system 300 as including certain components that are arranged in a certain way, system 300 may include additional or fewer components arranged differently. As an example, the control chips may be coupled to rigid circuit portion 130 differently from the type of coupling shown in FIG. 3. Similarly, the qubit chips may be coupled to rigid circuit portion 180 differently from the type of coupling shown in FIG. 3.

Figure 4:
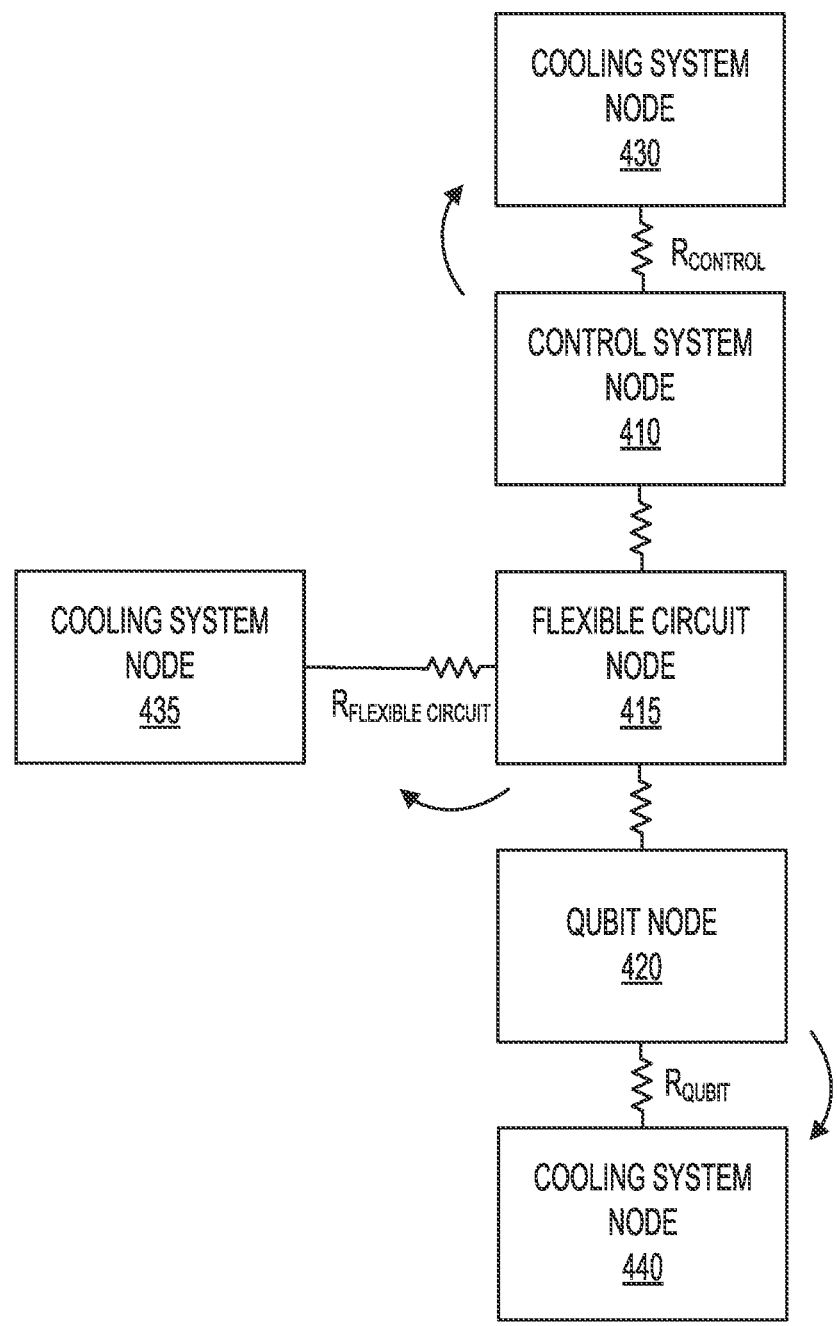
FIG. 4 shows a thermal-resistance model of the system of FIG. 3.

FIG. 4 shows a thermal-resistance model 400 of system 300 of FIG. 3. Similar to thermal-resistance model 200 of FIG. 2, each resistor ($R_{FLEXIBLE\ CIRCUIT}$, $R_{CONTROL}$, and $R_{QUBIT}$) in this thermal-resistance model 400 represents a certain amount of thermal resistance and the current flowing through the resistor can be viewed as the amount of heat flowing through the resistor. Thermal-resistance model 400 further includes a first cooling system node 430, a second cooling system node 435, and another cooling system node 440. In this model, the node labeled as control system node 410 corresponds to the temperature of the rigid circuit portion (e.g., rigid circuit portion 110 of FIG. 3) and the control circuitry for controlling qubits and the other node labeled as qubit node 420 corresponds to the temperature of the other rigid circuit portion (e.g., rigid circuit portion 170 of FIG. 3) and the qubit plane. Thermal-resistance model 400 further includes a node labeled as the flexible circuit node 415, which corresponds to flexible circuit portion 150 of FIG. 3.

Thermal-resistance model 400 may be used to evaluate and improve the performance of system 300 of FIG. 3 by computing heat transfer across regions. Despite there being a large temperature gradient between control system node 410 and qubit node 420, most of the heat dissipated by control system node 410 flows to cooling system node 430. As explained earlier, this approach is facilitated by using anisotropic thermal conductivity substrates where the heat transport is in the vertical direction relative to the device being cooled but not in the horizontal direction. Any additional heat further flows from flexible circuit node 415 to cooling system node 435. This facilitates independent heat removal from the control system node 410 and qubit node 440 while minimizing any heat flow between the two. Although not shown in FIG. 4, thermal resistance modeling for additional temperature stages and cooling systems may also be performed.

Figure 5:
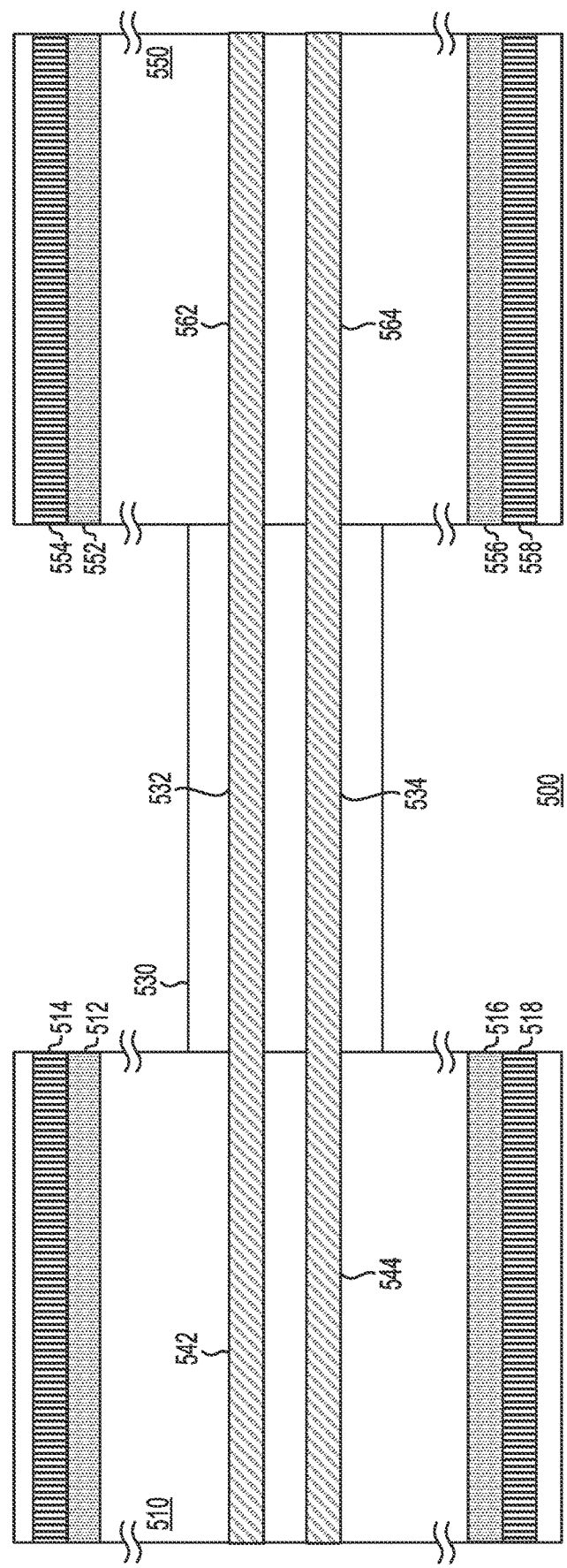
FIG. 5 shows a side view of a superconducting rigid-flex circuit for use with the systems of FIG. 1 and FIG. 2.

FIG. 5 shows a side view 500 of a superconducting rigid-flex circuit for use with the systems of FIG. 1 and FIG. 2. The superconducting rigid-flex circuit is shown as including a rigid circuit portion 510, a flexible circuit portion 530, and another rigid circuit portion 550. Flexible circuit portion 530 is shown as being formed with multiple layers of various materials, including superconducting metal interconnect layers 532 and 534. As shown in FIG. 5, interconnect layer 532 is formed integrally with both rigid circuit portion 510 and 550 such that a first part 542 of interconnect layer 532 extends into rigid circuit portion 510 and a second part 562 of interconnect layer 532 extends into rigid circuit portion 550. Similarly, interconnect layer 534 is formed integrally with both rigid circuit portion 510 and 550 such that a first part 544 of interconnect layer 534 extends into rigid circuit portion 510 and a second part 564 of interconnect layer 534 extends into rigid circuit portion 550. By forming superconducting rigid-flex circuit in this manner, the need for any connectors for connecting the rigid circuit portions with the flexible circuit portions is obviated. Rigid circuit portions can include additional superconducting interconnect layers or other conducting (e.g., non-superconducting metal) layers. Rigid circuit portions can also include non-superconducting layers and insulating layers for separating conductive layers. As an example, rigid circuit portion 510 shows non-superconducting metal layers 512 and 514. Rigid circuit portion 510 further shows insulating layers 514 and 518. Similarly, rigid circuit portion 550 shows non-superconducting metal layers 552 and 556. Rigid circuit portion 550 shows non-superconducting metal layers 554 and 558.

Advantageously, such formation of superconducting rigid-flex circuit allows for PCB-level wiring density without the connectors. Although FIG. 5 shows the superconducting rigid-flex circuit as having a certain number of components arranged in a certain manner, the superconducting rigid-flex circuit may include additional or fewer components that are arranged differently. As an example, although FIG. 5 shows rigid circuit portions 510 and 550 as having similar layers, they could have a different number and a different arrangement of layers. In addition, there may be additional rigid circuit portions and/or flexible circuit portions included as part of the superconducting rigid-flex circuit.

With continued reference to FIG. 5, superconducting rigid-flex circuit can be formed using printed-circuit board (PCB) manufacturing techniques. As an example, the superconducting rigid-flex PCB may be formed by forming various layers on a substrate. The circuit patterns may then be formed using laser imaging or photo imaging. Additional processing steps may be performed to ensure performance within the cryogenic environment described earlier.

FIG. 6 shows a side view 600 of a rigid circuit portion 630 of a superconducting rigid-flex circuit for use with the systems of FIG. 1 and FIG. 2. Rigid circuit portion 630 is shown with copper pillars 632, 634, 636, and 638 to transfer the heat vertically towards cooling system. Although not shown in FIG. 6, the PCB layers can also be formed to allow for thermal anisotropy such that the heat from devices 612, 614, and 616 is transferred in a vertical direction towards cooling system 620.

In conclusion, the present disclosure relates to a system including a qubit plane having at least one qubit chip associated with a first rigid circuit portion of a superconducting rigid-flex circuit. The system may further include a first cooling system operable to maintain an operating temperature for the qubit plane and the first rigid circuit portion of the superconducting rigid-flex circuit at or below 100 milli-kelvin.

The system may further include a control system having at least one control chip associated with a second rigid circuit portion of the superconducting rigid-flex circuit. The system may further include a second cooling system operable to maintain an operating temperature for the control system and the second rigid circuit portion of the superconducting rigid-flex circuit at or below 10 kelvin, allowing the at least one control chip to dissipate heat to the second cooling system within a thermal budget commensurate with an amount of power required to provide control signals to control qubits within the at least one qubit chip. The system may further include a flexible circuit portion of the superconducting rigid-flex circuit for interconnecting the first rigid circuit portion of the superconducting rigid-flex circuit with the second rigid circuit portion of the superconducting rigid-flex circuit.

The first cooling system may comprise a dilution refrigerator, a pumped helium-3 system, or a pumped helium-4 system and the second cooling system may comprise a cold plate. The superconducting rigid-flex circuit may comprise a single printed circuit board.

The flexible circuit portion of the superconducting rigid-flex circuit may be formed such that at least a subset of a plurality of interconnect layers formed within the flexible circuit portion extend into each of the first rigid circuit portion and the second rigid circuit portion, allowing for an interconnection between the first rigid circuit portion and the second rigid circuit portion. The subset of the plurality of interconnect layers may comprise a superconducting metal.

The qubits may comprise topological qubits that are operated within a magnetic field, and the second rigid circuit portion may be mounted on a cold finger surrounded by a magnet. The first cooling system may be independent from the second cooling system.

In another example, the present disclosure relates to a method including providing a qubit plane having at least one qubit chip associated with a first rigid circuit portion of a superconducting rigid-flex circuit. The method may further include using a first cooling system maintaining an operating temperature for the qubit plane and the first rigid circuit portion of the superconducting rigid-flex circuit at or below 100 milli-kelvin.

The method may further include providing a control system having at least one control chip associated with a second rigid circuit portion of the superconducting rigid-flex circuit. The method may further include using a second cooling system maintaining an operating temperature for the control system and the second rigid circuit portion of the superconducting rigid-flex circuit at or below 10 kelvin, allowing the control chips to dissipate heat to the second cooling system within a thermal budget commensurate with an amount of power required to provide control signals to control qubits within the at least one qubit chip. The method may further include providing a flexible circuit portion of the superconducting rigid-flex circuit for interconnecting the first rigid circuit portion of the superconducting rigid-flex circuit with the second rigid circuit portion of the superconducting rigid-flex circuit.

The first cooling system may comprise a dilution refrigerator, a pumped helium-3 system, or a pumped helium-4 system and the second cooling system may comprise a cold plate. The superconducting rigid-flex circuit may comprise a single printed circuit board.

The flexible circuit portion of the superconducting rigid-flex circuit may be formed such that at least a subset of a plurality of interconnect layers formed within the flexible circuit portion extend into each of the first rigid circuit portion and the second rigid circuit portion, allowing for an interconnection between the first rigid circuit portion and the second rigid circuit portion. The subset of the plurality of interconnect layers may comprise a superconducting metal.

The qubits may comprise topological qubits that are operated within a magnetic field, and the second rigid circuit portion may be mounted on a cold finger surrounded by a magnet. The first cooling system may be independent from the second cooling system.

In yet another example, the present disclosure relates to a system configured to operate in a cryogenic environment, where the cryogenic environment has a vacuum with a pressure in a range of $10^{-3}$ Torr to $10^{-10}$ Torr. The system may further include a qubit plane having qubit chips associated with a first rigid circuit portion of a superconducting rigid-flex circuit. The system may further include a first cooling system operable to maintain an operating temperature for the qubit plane and the first rigid circuit portion of the superconducting rigid-flex circuit at or below 100 milli-kelvin.

The system may further include a control system having control chips associated with a second rigid circuit portion of the superconducting rigid-flex circuit. The system may further include a second cooling system operable to maintain an operating temperature for the control system and the second rigid circuit portion of the superconducting rigid-flex circuit at or below 10 kelvin, allowing the control chips to dissipate heat to the second cooling system within a thermal budget commensurate with an amount of power required to provide control signals to control qubits within the qubit chips.

The system may further include a flexible circuit portion of the superconducting rigid-flex circuit for interconnecting, and yet thermally isolating, the first rigid circuit portion of the superconducting rigid-flex circuit with the second rigid circuit portion of the superconducting rigid-flex circuit. The system may further include a third cooling system operable to maintain an operating temperature of the flexible circuit portion within a range of 100 milli-kelvin to 10 kelvin.

The second cooling system may comprise a cold plate and each of the first cooling system and the third cooling system may comprise a dilution refrigerator, a pumped helium-3 system, or a pumped helium-4 system. The flexible circuit portion of the superconducting rigid-flex circuit may be formed such that at least a subset of a plurality of interconnect layers formed within the flexible circuit portion extend into each of the first rigid circuit portion and the second rigid circuit portion, allowing for an interconnection between the first rigid circuit portion and the second rigid circuit portion.

The subset of the plurality of interconnect layers may comprise a superconducting metal. The qubits may comprise topological qubits that are operated within a magnetic field, and the second rigid circuit portion may be mounted on a cold finger surrounded by a magnet.

It is to be understood that the methods, modules, and components depicted herein are merely exemplary. Alternatively, or in addition, the functionality described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), and Complex Programmable Logic Devices (CPLDs). In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A system comprising:
   a qubit plane having at least one qubit chip associated with a first rigid circuit portion of a superconducting rigid-flex circuit;
   a first cooling system operable to maintain an operating temperature for the qubit plane and the first rigid circuit portion of the superconducting rigid-flex circuit at or below 100 milli-kelvin;
   a control system having at least one control chip associated with a second rigid circuit portion of the superconducting rigid-flex circuit;
   a second cooling system operable to maintain an operating temperature for the control system and the second rigid circuit portion of the superconducting rigid-flex circuit at or below 10 kelvin, allowing the at least one control chip to dissipate heat to the second cooling system within a thermal budget commensurate with an amount of power required to provide control signals to control qubits within the at least one qubit chip; and
   a flexible circuit portion of the superconducting rigid-flex circuit for interconnecting the first rigid circuit portion of the superconducting rigid-flex circuit with the second rigid circuit portion of the superconducting rigid-flex circuit.

2. The system of claim 1, wherein the first cooling system comprises a dilution refrigerator, a pumped helium-3 system, or a pumped helium-4 system and the second cooling system comprises a cold plate.

3. The system of claim 1, wherein the superconducting rigid-flex circuit comprises a single printed circuit board.

4. The system of claim 1, wherein the flexible circuit portion of the superconducting rigid-flex circuit is formed such that at least a subset of a plurality of interconnect layers formed within the flexible circuit portion extend into each of the first rigid circuit portion and the second rigid circuit portion, allowing for an interconnection between the first rigid circuit portion and the second rigid circuit portion.

5. The system of claim 4, wherein the subset of the plurality of interconnect layers comprises a superconducting metal.

6. The system of claim 1, wherein the qubits comprise topological qubits that are operated within a magnetic field, and wherein the second rigid circuit portion is mounted on a cold finger surrounded by a magnet.

7. The system of claim 1, wherein the first cooling system is independent from the second cooling system.

8. A method comprising:
   providing a qubit plane having at least one qubit chip associated with a first rigid circuit portion of a superconducting rigid-flex circuit;
   using a first cooling system maintaining an operating temperature for the qubit plane and the first rigid circuit portion of the superconducting rigid-flex circuit at or below 100 milli-kelvin;
   providing a control system having at least one control chip associated with a second rigid circuit portion of the superconducting rigid-flex circuit;
   using a second cooling system maintaining an operating temperature for the control system and the second rigid circuit portion of the superconducting rigid-flex circuit at or below 10 kelvin, allowing the control chips to dissipate heat to the second cooling system within a thermal budget commensurate with an amount of power required to provide control signals to control qubits within the at least one qubit chip; and providing a flexible circuit portion of the superconducting rigid-flex circuit for interconnecting the first rigid circuit portion of the superconducting rigid-flex circuit with the second rigid circuit portion of the superconducting rigid-flex circuit.

9. The method of claim 8, wherein the first cooling system comprises a dilution refrigerator, a pumped helium-3 system, or a pumped helium-4 system and the second cooling system comprises a cold plate.

10. The method of claim 8, wherein the superconducting rigid-flex circuit comprises a single printed circuit board.

11. The method of claim 8, wherein the flexible circuit portion of the superconducting rigid-flex circuit is formed such that at least a subset of a plurality of interconnect layers formed within the flexible circuit portion extend into each of the first rigid circuit portion and the second rigid circuit portion, allowing for an interconnection between the first rigid circuit portion and the second rigid circuit portion.

12. The method of claim 11, wherein the subset of the plurality of interconnect layers comprises a superconducting metal.

13. The method of claim 8, wherein the qubits comprise topological qubits that are operated within a magnetic field, and wherein the second rigid circuit portion is mounted on a cold finger surrounded by a magnet.

14. The method of claim 8, wherein the first cooling system is independent from the second cooling system.

15. A system configured to operate in a cryogenic environment, wherein the cryogenic environment having a vacuum with a pressure in a range of $10^{-3}$ Torr to $10^{-10}$ Torr, the system comprising:
  a qubit plane having qubit chips associated with a first rigid circuit portion of a superconducting rigid-flex circuit;
  a first cooling system operable to maintain an operating temperature for the qubit plane and the first rigid circuit portion of the superconducting rigid-flex circuit at or below 100 milli-kelvin;
  a control system having control chips associated with a second rigid circuit portion of the superconducting rigid-flex circuit;
  a second cooling system operable to maintain an operating temperature for the control system and the second rigid circuit portion of the superconducting rigid-flex circuit at or below 10 kelvin, allowing the control chips to dissipate heat to the second cooling system within a thermal budget commensurate with an amount of power required to provide control signals to control qubits within the qubit chips;
  a flexible circuit portion of the superconducting rigid-flex circuit for interconnecting, and yet thermally isolating, the first rigid circuit portion of the superconducting rigid-flex circuit with the second rigid circuit portion of the superconducting rigid-flex circuit; and
  a third cooling system operable to maintain an operating temperature of the flexible circuit portion within a range of 100 milli-kelvin to 10 kelvin.

16. The system of claim 15, wherein the second cooling system comprises a cold plate and each of the first cooling system and the third cooling system comprises a dilution refrigerator, a pumped helium-3 system, or a pumped helium-4 system.

17. The system of claim 15, wherein the superconducting rigid-flex circuit comprises a single printed circuit board.

18. The system of claim 17, wherein the flexible circuit portion of the superconducting rigid-flex circuit is formed such that at least a subset of a plurality of interconnect layers formed within the flexible circuit portion extend into each of the first rigid circuit portion and the second rigid circuit portion, allowing for an interconnection between the first rigid circuit portion and the second rigid circuit portion.

19. The system of claim 18, wherein the subset of the plurality of interconnect layers comprises a superconducting metal.

20. The system of claim 15, wherein the qubits comprise topological qubits that are operated within a magnetic field, and wherein the second rigid circuit portion is mounted on a cold finger surrounded by a magnet.

* * * * *